US008278769B2

(12) United States Patent
Frank

(10) Patent No.: US 8,278,769 B2
(45) Date of Patent: Oct. 2, 2012

(54) COMPOUND SEMICONDUCTOR DEVICE AND CONNECTORS

(75) Inventor: Michael Frank, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 544 days.

(21) Appl. No.: 12/496,732

(22) Filed: Jul. 2, 2009

(65) Prior Publication Data

US 2011/0001241 A1  Jan. 6, 2011

(51) Int. Cl.
*H01L 23/482* (2006.01)
(52) U.S. Cl. ............... 257/786; 257/744; 257/E23.015
(58) Field of Classification Search .................. None
See application file for complete search history.

(56) References Cited

U.S. PATENT DOCUMENTS

| | | | |
|---|---|---|---|
| 6,737,687 B2 * | 5/2004 | Baba et al. .................. 257/276 |
| 7,126,227 B2 * | 10/2006 | Yamaguchi .................. 257/778 |
| 7,141,879 B2 | 11/2006 | Wakamiya et al. |
| 7,271,084 B2 | 9/2007 | Jeong et al. |
| 7,728,430 B2 * | 6/2010 | Yamaguchi .................. 257/737 |
| 7,880,289 B2 * | 2/2011 | Kim .............................. 257/693 |
| 8,125,009 B2 * | 2/2012 | Kawashima .................. 257/288 |
| 2005/0029666 A1 * | 2/2005 | Kurihara et al. ............. 257/772 |
| 2005/0227408 A1 * | 10/2005 | Leib et al. ...................... 438/106 |
| 2005/0285154 A1 * | 12/2005 | Akram et al. ................ 257/234 |
| 2008/0035959 A1 * | 2/2008 | Jiang ............................ 257/204 |
| 2008/0116537 A1 * | 5/2008 | Adkisson et al. ............. 257/448 |
| 2008/0296764 A1 | 12/2008 | Chang et al. |

FOREIGN PATENT DOCUMENTS

WO  2009/013678 A2  1/2009
WO  2009/016531 A2  2/2009

* cited by examiner

*Primary Examiner* — Benjamin Sandvik

(57) ABSTRACT

A semiconductor device includes a semiconductor substrate formed from compound semiconductor material and multiple conductive connecting pads. The connecting pads are symmetrically arranged on a first surface of the semiconductor substrate in an interweaving pattern. Each cleavage plane extending across the first surface of the semiconductor substrate intersects a portion of at least one connecting pad of the plurality of connecting pads.

20 Claims, 4 Drawing Sheets

COMPOUND SEMICONDUCTOR DEVICE AND CONNECTORS

BACKGROUND

In wafer scale packaging, an entire wafer including a semiconductor substrate is packaged prior to being separated into individual semiconductor devices (chips or dies). The subsequently separated semiconductor devices may then be attached as separate, prepackaged components to other devices, such as printed circuit boards, by soldering or other attachment technique, to form various products. Wafer scale packaging thus increases efficiency in fabrication and assembly of semiconductor devices and products.

Wafers increasingly are formed from compound semiconductor materials as the semiconductor substrates, such as gallium arsenide (GaAs) and indium phosphide (InP), for example. The compound semiconductor materials provide improved electronic properties, resulting in faster semiconductor devices, such as transistors, diodes, light-emitting diodes, etc., than silicon based counterparts. However, compound semiconductor materials tend to be brittle, which increases the chances of cracking or fracturing, particularly during periods of high physical stress during manufacturing processes. For example, soldering a packaged semiconductor device requires application of heat, which may cause fractures in the compound semiconductor material, e.g., along cleavage planes.

FIG. 1 is a plan view of prior art wafer scale packaged semiconductor device 100, which includes semiconductor substrate 110 having a bottom surface 111. The bottom surface 111 includes three connecting strips 121-123, which may be formed from an electrically conductive material, such as gold, gold-tin alloy, or the like. The connecting strips 121-123 have corresponding exposed areas 121'-123', which are respectively defined by an insulating material applied to the bottom surface 111 of the substrate 110 and the connecting strips 121-123. The exposed areas 121'-123' enable the semiconductor device 100 to be soldered to a printed circuit board (not shown), for example.

As shown in FIG. 1, the exposed areas 121'-123' are aligned along vertical line A-A'. Accordingly, when the semiconductor device 100 is soldered to the printed circuit board, e.g., by applying soldering paste or solder balls, the substrate 110 may tilt or rotate about the vertical line A-A', resulting in a skewed orientation between the bottom surface 111 of the substrate 110 and the top surface of the printed circuit board. Further, although the connecting strips 121-123 provide physical support to the substrate 110, which helps to prevent cracks or fractures along cleavage planes of the substrate 110, the layout of the connecting strips 121-123 in FIG. 1 allows cleavage planes to run the width (or length) of the substrate 110 without intersecting any portion of the connecting strips 121-123, where the substrate 110 is susceptible to fracturing. The substrate 110 is particularly susceptible to fracturing along the straight edges of the connecting strips 121-123, as indicated, for example, by horizontal line B-B' of FIG. 1.

SUMMARY

In a representative embodiment, a semiconductor device includes a semiconductor substrate formed from compound semiconductor material, and multiple conductive connecting pads symmetrically arranged on a first surface of the semiconductor substrate in an interweaving pattern. Each cleavage plane extending across the first surface of the semiconductor substrate intersects a portion of at least one connecting pad of the multiple connecting pads.

In another representative embodiment, a wafer formed from a compound semiconductor substrate includes dies corresponding to semiconductor devices. Each die includes multiple conductive connecting pads symmetrically arranged on a first surface of the semiconductor substrate, each connecting pad having a complex geometric shape to enable formation of an interweaving pattern of connecting pads. Each die further includes multiple conductive interconnectors extending through the semiconductor substrate to electrically connect the connecting pads to a trace pattern arranged on a second surface of the semiconductor substrate. The interweaving pattern of the connecting pads positions a portion of at least one connecting pad along each cleavage plane of the semiconductor substrate.

In another representative embodiment, an encapsulated semiconductor device includes a semiconductor substrate formed from gallium arsenide (GaAs), multiple conductive connecting pads, a circuit and a cap. The connecting pads are symmetrically arranged on a substantially planar bottom surface of the semiconductor substrate in an interweaving pattern, enabling soldering of the semiconductor device to a printed circuit board. Each line corresponding to a cleavage plane of the semiconductor substrate and extending across the bottom surface intersects a portion of at least one connecting pad of the multiple connecting pads. The circuit is arranged on a substantially planar top surface of the semiconductor substrate, the circuit being electrically connected to the connecting pads via conductive interconnectors extending through the semiconductor substrate. The cap may be formed from GaAs, and covers the top surface of the semiconductor substrate to protect the circuit.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
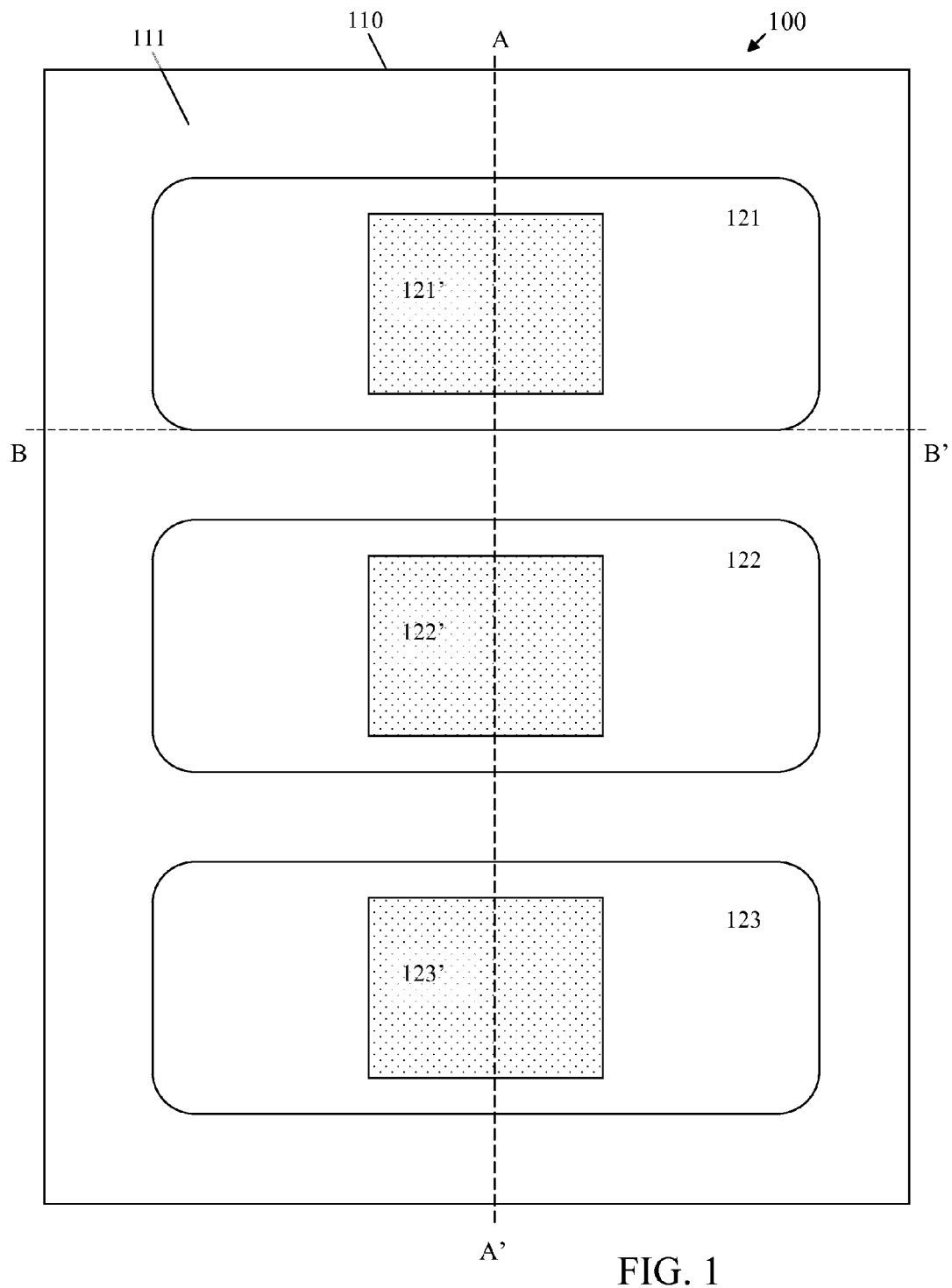
FIG. 1 is plan view illustrating solder pads of a prior art semiconductor device.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

According to various embodiments, a semiconductor device formed from a wafer includes a semiconductor substrate made of compound semiconductor material. The semiconductor device includes multiple connecting pads symmetrically arranged on its bottom surface for establishing electrical and mechanical connections with another device, such as a printed circuit board. The connecting pads have complex geometric shapes that enable the connected pads to be arranged in an interweaving pattern. The interweaving pattern of the connecting pads prevents any line, representing an edge of a cleavage plane of semiconductor substrate, from extending across a bottom surface of the semiconductor substrate without encountering a portion of at least one of the connecting pads, thus reinforcing the otherwise brittle compound semiconductor material and reducing susceptibility to fracturing along the cleavage planes.

Figure 2:
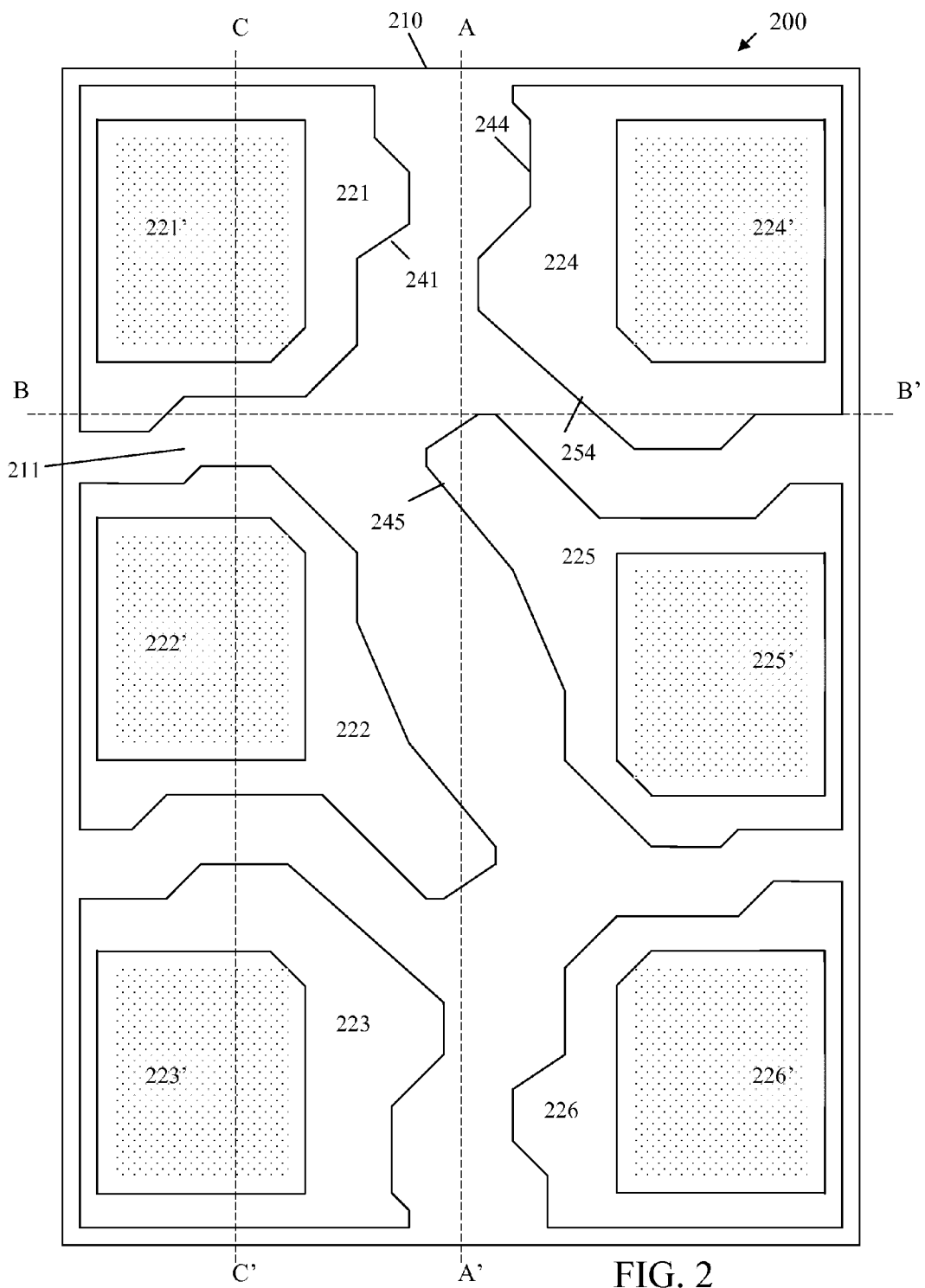
FIG. 2 is a plan view illustrating solder pads of a semiconductor device, according to a representative embodiment.

FIG. 2 is a plan view of semiconductor device 200, according to a representative embodiment.

The semiconductor device 200 is wafer scale device, for example, that includes semiconductor substrate 210. The substrate 210 may be formed from a compound semiconductor material, such as gallium arsenide (GaAs), indium phosphide (InP), or the like. The semiconductor device 200 represents one die of the wafer, e.g., after the wafer has been separated. It is understood that multiple dies or semiconductor devices 200 may be included in the original wafer, each having the same pattern and layout of connecting pads, discussed below. The semiconductor device 200 may be all or part of any type of electronic component or element, consisting of transistors, capacitors, and resistors, for example.

FIG. 2 depicts a substantially planar bottom surface 211 of the substrate 210. In the depicted embodiment, representative semiconductor device 200 includes six connecting pads 221-226. The connecting pads 221-226 may be formed from an electrically conductive material such as gold, gold-tin alloy, or the like. The connecting pads 221-226 have corresponding exposed areas 221'-226', which are respectively defined by openings formed in an insulating material, such as glass, applied to the bottom surface 211 of the substrate 210 and the connecting pads 221-226, as discussed below with respect to insulating pattern 360 of FIG. 3. In an embodiment, the exposed areas 221'-226' are substantially the same size and/or shape, regardless of the sizes and shapes of the corresponding connecting pads 221-226. However, different sizes and shapes may be incorporated without departing from the scope of the present teachings.

The exposed areas 221'-226' of the connecting pads 221-226 enable the semiconductor device 200 to be electrically and/or mechanically connected to a printed circuit board (not shown) or other device. For example, conductive soldering paste may be applied to the exposed areas 221'-226' (as well as the insulating pattern 360), or solder balls may be applied to the exposed areas 221', to establish a connection between the exposed areas 221'-226' and corresponding conductive pads on a substantially planar surface of the printed circuit board.

The solder attach process requires that the solder melt during assembly. This melted solder has considerable surface tension. The surface tension must be balanced to prevent the component being soldered from tilting. For purposes of explanation, FIG. 2 depicts an example in which the connecting pads 221-226 are arranged in columns and rows, such that pairs of connecting pads 221/224, 222/225 and 223/226 are distributed substantially symmetrically on either side of vertical line A-A'. Accordingly, when the semiconductor device 200 is connected to the printed circuit board using soldering paste, for example, the symmetrical arrangement of the pairs of connecting pads 221/224, 222/225 and 223/226 prevents tilting by ensuring that the surface tension is symmetrical about line A-A'. For example, with respect to connecting pads 221 and 224 in the first row of the semiconductor device 200, soldering paste is deposited on the corresponding exposed areas 221' and 224' evenly positioned about the vertical line A-A', so the semiconductor device 200 will not tilt, i.e., rotate about the vertical line A-A', or otherwise shift with respect tot the printed circuit board. Likewise, as long as there are at least two rows of connecting pads, the semiconductor device 200 will not tilt, i.e., rotate, about horizontal lines, such as representative horizontal line B-B'.

In addition, the connecting pads 221-226 have complex geometric shapes and are arranged in an interweaving pattern, the purpose of which is to prevent having cleavage planes that cross the substrate 210 where there is no mechanical reinforcement provided by the metallic (e.g., gold) connecting pads 221-226. For example, vertical line A-A' passes through extended portions of connecting pads 222 and 225, respectively. Therefore, the substrate 210 is less likely to fracture along the cleavage plane otherwise indicated by the vertical line A-A' when the substrate 210 is under physical stress, such as exposure to temperature fluctuations or mechanical forces. Also, in an embodiment, the geometric shapes of the connecting pads 221-226 are arranged such that edges of any two connecting pads 221-226 do not align with one another along the same cleavage plane. For example, horizontal line B-B', which passes through portions of connecting pads 221 and 224, aligns with a horizontal edge of connecting pad 224, but does not align with any edges of connecting pad 221. Therefore, the substrate 210 is less likely to fracture along the cleavage plane otherwise indicated by the horizontal line B-B'. In other words, as shown in FIG. 2, the shapes and arrangement of the connecting pads 221-226 prevent any line (i.e., edge of a cleavage plane) from extending across the bottom surface 211 of the substrate 210 without passing through a portion of at least one of the metallic connecting pads 221-226. Thus, the connecting pads 221-226 reinforce the otherwise brittle material of the substrate 210.

In the depicted representative embodiment, the semiconductor device 200 includes six connecting pads 221-226 having representative complex geometric shapes. A complex geometric shape generally refers to an irregular shape in the plane of the bottom surface 211, having at least one extended portion that protrudes from the main body of the shape. Alternatively or in addition, a complex geometric shape may include at least one indention or truncated portion.

In an embodiment, an extended portion from a first complex geometric shape (of a first connecting pad) may correspond to a truncated portion of an adjacent second complex geometric shape (of a second connecting pad), enabling the extended portion to protrude into an area at least partially occupied by the main body of the second complex geometric shape, creating the interweaving pattern among the connecting pads. For example, referring to the illustrative configuration depicted in FIG. 2, connecting pad 221 has extended portion 241 and connecting pad 224 has first truncated portion 244, which substantially corresponds to and accommodates the extended portion 241. Likewise, for example, connecting pad 225 has extended portion 245 and connecting pad 224 has second truncated portion 254, which substantially corresponds to and accommodates the extended portion 245. The arrangement of extended portions and complementary truncated portions enable the creation of the interweaving pattern of connecting pads 221-226.

It is understood that the number, arrangement and specific shapes may vary to provide unique benefits for any particular situation or to meet application specific design requirements of various implementations, as would be apparent to one skilled in the art.

Figure 3:
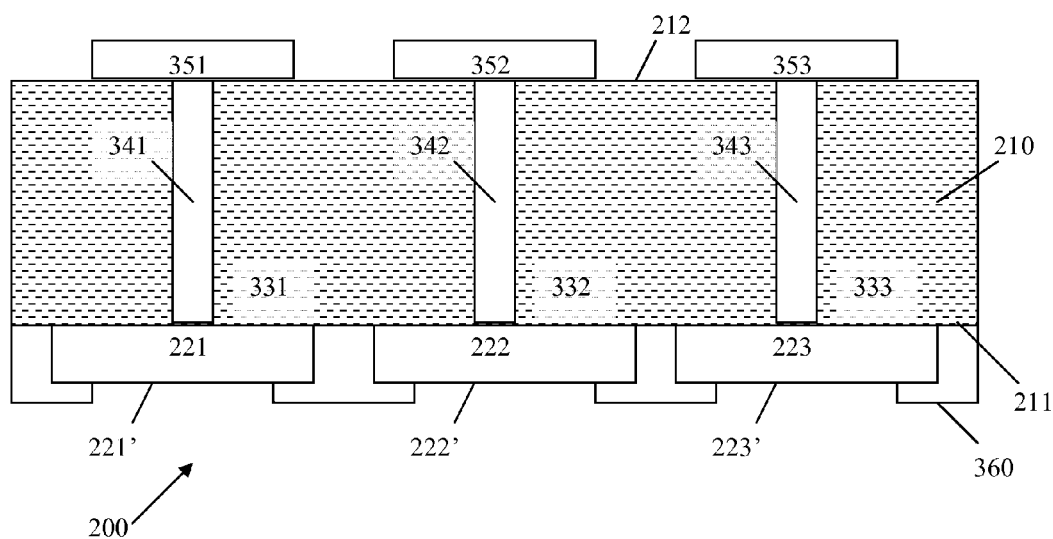
FIG. 3 is a cross-sectional diagram illustrating a simplified cross-section of a semiconductor device, according to a representative embodiment.

FIG. 3 is a cross-sectional diagram of semiconductor device 200, according to a representative embodiment, taken along vertical line C-C' of FIG. 2.

Referring to FIG. 3, the semiconductor device 200 includes semiconductor substrate 210, having substantially planer bottom surface 211 and substantially planar top surface 212. The substrate 210 is formed of a compound semiconductor material, such as GaAs, InP, or the like, as discussed above.

Attached to the bottom surface 211 of the substrate 210 is a pattern of connecting pads having complex geometric shapes, indicated in FIG. 3 as connecting pads 221-223, as discussed above with reference to FIG. 2. The connecting pads 221-223 may be formed of gold, gold-tin alloy, or other conductive metal. In an embodiment, the connecting pads 221-223 are formed by applying a gold layer, for example, to the bottom surface 211 and patterning the gold layer using any of various semiconductor processing techniques. The patterning and etching process provides complex geometric shapes of connecting pads 221-223, as shown in FIG. 2.

An insulting layer is applied to the bottom surface 211 and the connecting pads 221-223. The insulating layer is patterned to produce insulating pattern 360, which provides openings over portions of the connecting pads 221-223, defining corresponding exposed areas 221'-223'. The insulating layer may be patterned, for example, using photolithography, although various alternative techniques may be incorporated. As a result, the semiconductor device 200 may be electrically and/or mechanically connected to another device, such as a printed circuit board (not shown) by means for the exposed areas 221'-223'. For example, a soldering paste may be applied over the insulating pattern 360 and exposed areas 221'-223', or solder balls may be applied to the exposed areas 221'-223', establishing electrical connections between the connecting pads 221-223 and corresponding connecting pads on the printed circuit board, via the exposed areas 221'-223'.

In the depicted embodiment, contacts 351-353 are positioned on the top surface 212 of the substrate 210. The contacts 351-353 may be formed of gold, gold-tin alloy, or other conductive metal, and electrically connect with circuitry (e.g., including trace patterns) of the semiconductor device 200. In an embodiment, the contacts 351-353 are formed by applying a gold layer to the top surface 212, and patterning the gold layer, for example, using photolithography, although various alternative techniques may be incorporated.

Vias 331-333 extend through the substrate 210 between connecting pads 221-223 and contacts 351-353, respectively. The vias 331-333 are filled with conductive material to provide interconnectors 341-343, respectively, for establishing electrical connections between connecting pads 221-223 and contacts 351-353. The vias 331-333 may be formed in the substrate 210, prior to formation of the contacts 351-353, by machining or by chemically etching the substrate 210 using photolithography, although various alternative techniques may be incorporated. Thus, for example, interconnector 341 extending through substrate 210 in via 331 electrically connects contact 352 to connecting pad 221. As a result, when the printed circuit board (not shown) is attached to the connecting pads 221-223 of the semiconductor device 200, it may be electrically connected to the circuitry of the semiconductor device 200 connected to the contacts 351-353.

Figure 4:
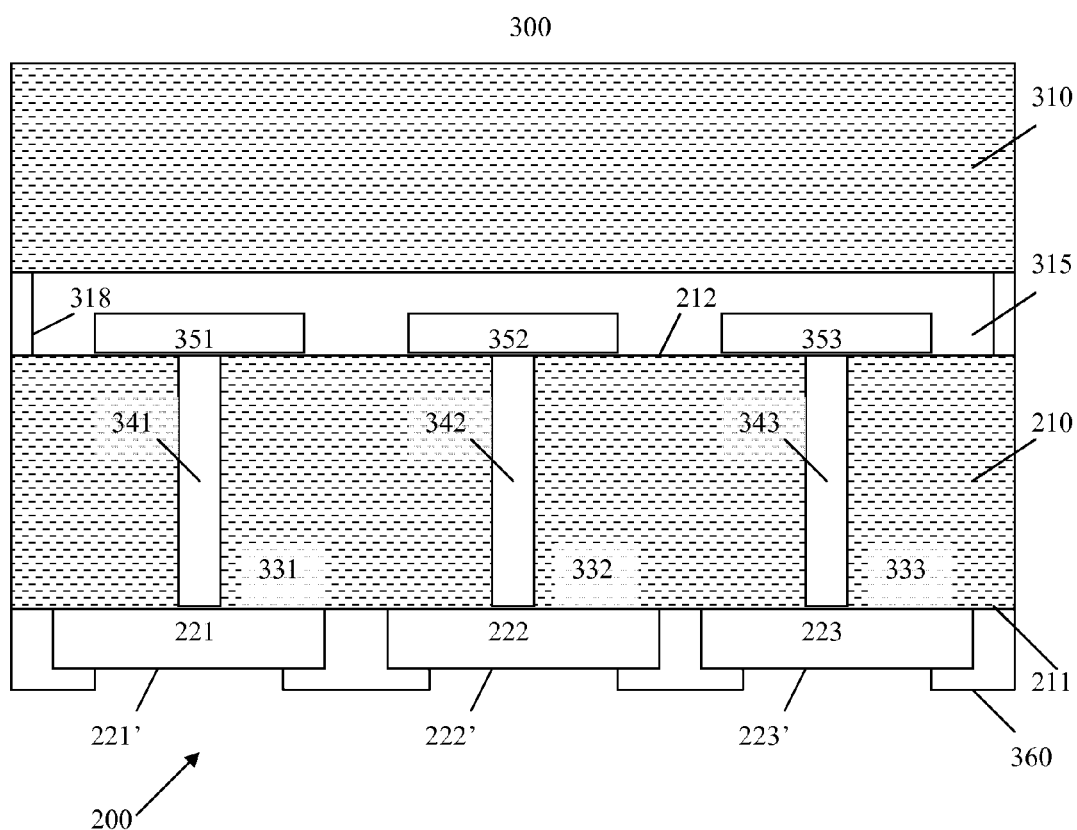
FIG. 4 is a cross-sectional diagram illustrating a simplified cross-section of an encapsulated semiconductor device, according to a representative embodiment.

FIG. 4 is a cross-sectional diagram of encapsulated semiconductor device 300, according to a representative embodiment, taken along vertical line C-C' of FIG. 2.

Referring to FIG. 4, the encapsulated semiconductor device 300 includes the semiconductor device 200, discussed above with reference to FIG. 2. In addition, the encapsulated semiconductor device 300 includes annular sealing ring 318 and cap 310 which are sequentially positioned on the top surface 212 of the semiconductor device 200, forming air gap 315. In an embodiment, the cap 310 may be formed of the same compound semiconductor material as the substrate 210, such as GaAs or InP, and the sealing ring 318 may be formed of an insulating material, such as polyimide. However, the cap 310 and the sealing ring 318 may be formed of other materials, without departing from the scope of the present teachings.

The addition of the cap 310 and the sealing ring 318 creates a prepackaged, integral encapsulated semiconductor device 300, in which the circuitry is substantially insulated and protected. In an embodiment, resin (not shown) may also be applied to the encapsulated semiconductor device 300 for enhanced sealing. As stated above, the encapsulated semiconductor device 300 may then be attached, e.g., through soldering, to another device, e.g., a printed circuit board, at predetermined locations to form part of a larger device.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A semiconductor device, comprising:
   a semiconductor substrate comprising compound semiconductor material; and
   a plurality of conductive connecting pads symmetrically arranged on a first surface of the semiconductor substrate in an interweaving pattern, at least one of the conductive connecting pads having a complex geometric shape defining an extended portion for providing the interweaving pattern,
   wherein each cleavage plane extending across the first surface of the semiconductor substrate intersects a portion of at least one connecting pad of the plurality of connecting pads.

2. The semiconductor device of claim 1, wherein at least one other conductive connecting pad of the plurality of connecting pads having a complex geometric shape defining a truncated portion complementary to the extended portion of the at least one complex geometric shape defining the extended portion for providing the interweaving pattern.

3. The semiconductor device of claim 2, wherein each of the plurality of connecting pads comprises gold.

4. The semiconductor device of claim 2, wherein the compound semiconductor material comprises gallium arsenide (GaAs).

5. The semiconductor device of claim 2, wherein the compound semiconductor material comprises indium phosphide (InP).

6. The semiconductor device of claim 1, wherein the symmetrical arrangement of the plurality of connecting pads is configured to prevent tilting of the first surface of the semiconductor substrate with respect to a surface of a mounting device, when the plurality of conductive connecting pads are soldered to the surface of the mounting device.

7. The semiconductor device of claim 6, wherein the mounting device comprises a printed circuit board.

8. The semiconductor device of claim 1, further comprising:
   a plurality of contacts arranged on a second surface of the semiconductor substrate and contacting electronic circuitry of the semiconductor device, the second surface opposite to the first surface; and
   a plurality of interconnectors corresponding to the plurality of connecting pads on the first surface of the semiconductor substrate, each interconnector electrically connecting the corresponding connecting pad to at least one contact on the second surface of the semiconductor substrate.

9. A wafer formed from a compound semiconductor substrate, the wafer comprising a plurality of dies corresponding to semiconductor devices, each die comprising:
   a plurality of conductive connecting pads symmetrically arranged on a first surface of the semiconductor substrate, each connecting pad having a complex geometric shape to enable formation of an interweaving pattern of connecting pads; and
   a plurality of conductive interconnectors extending through the semiconductor substrate to electrically connect the connecting pads to a trace pattern arranged on a second surface of the semiconductor substrate,
   wherein the interweaving pattern of the connecting pads positions a portion of at least one connecting pad along each cleavage plane of the semiconductor substrate.

10. The semiconductor device of claim 9, wherein at least one complex geometric shape of the connecting pads defines an extended portion, and wherein at least another complex geometric shape defines a truncated portion complementary to the at least one extended portion, to create the interweaving pattern.

11. The semiconductor device of claim 9, wherein each of the connecting pads comprises gold.

12. The semiconductor device of claim 11, wherein the compound semiconductor material comprises gallium arsenide (GaAs).

13. The semiconductor device of claim 11, wherein the compound semiconductor material comprises indium phosphide (InP).

14. An encapsulated semiconductor device, comprising:
   a semiconductor substrate comprising gallium arsenide (GaAs);
   a plurality of conductive connecting pads symmetrically arranged on a substantially planar bottom surface of the semiconductor substrate in an interweaving pattern, enabling soldering of the semiconductor device to a printed circuit board, wherein each line corresponding to a cleavage plane of the semiconductor substrate and extending across the bottom surface intersects a portion of at least one connecting pad of the plurality of connecting pads;
   a circuit arranged on a substantially planar top surface of the semiconductor substrate, the circuit being electrically connected to the plurality of connecting pads via a corresponding plurality of conductive interconnectors extending through the semiconductor substrate; and
   a cap covering the top surface of the semiconductor substrate to protect the circuit.

15. The semiconductor device of claim 14, wherein each connecting pad has a complex geometric shape, at least one complex geometric shape defining an extended portion for providing the interweaving pattern.

16. The semiconductor device of claim 15, wherein each of the plurality of connecting pads comprises gold and the cap comprises GaAs.

17. The semiconductor device of claim 16, further comprising:
   a sealing ring separating the semiconductor substrate and the cap, the sealing ring defining a sealed air gap between the top surface of the semiconductor substrate and a substantially planar bottom surface of the cap.

18. The semiconductor device of claim 14, further comprising:
   a glass layer covering the bottom surface of the semiconductor substrate, the glass layer defining a plurality of openings corresponding to the plurality of connecting pads to expose an area of each connecting pad.

19. The semiconductor device of claim 18, wherein the exposed areas of the connecting pads are substantially equal in area.

20. The semiconductor device of claim 19, wherein the symmetrical arrangement of the plurality of connecting pads is configured to prevent tilting of the bottom surface of the semiconductor substrate with respect to a substantially planar top surface of the printed circuit board during soldering of the semiconductor device to the printed circuit board.

\* \* \* \* \*